United States Patent [19]

Wilcox

[11] Patent Number: 4,667,161

[45] Date of Patent: May 19, 1987

[54] PULSE SHAPING WITH TRANSMISSION LINES

[75] Inventor: Russell B. Wilcox, Oakland, Calif.

[73] Assignee: The United States of America as represented by the United States Department of Energy, Washington, D.C.

[21] Appl. No.: 765,780

[22] Filed: Aug. 15, 1985

[51] Int. Cl.[4] .................. H03K 5/01; H03K 5/159
[52] U.S. Cl. ........................ 328/65; 307/268; 328/67; 333/20
[58] Field of Search ............ 307/264, 268; 328/65, 328/67; 333/20, 23

[56] References Cited

U.S. PATENT DOCUMENTS

| | | | |
|---|---|---|---|
| 2,863,127 | 12/1958 | Albersheim | 333/20 |
| 2,871,453 | 1/1959 | Bradley | 333/20 |
| 3,405,287 | 10/1968 | Miller | 328/65 |
| 4,176,285 | 11/1979 | Norris | 328/65 |

Primary Examiner—John Zazworsky
Attorney, Agent, or Firm—Henry P. Sartorio; Clifton E. Clouse, Jr.; Judson R. Hightower

[57] ABSTRACT

A method and apparatus for forming shaped voltage pulses uses passive reflection from a transmission line with nonuniform impedance. The impedance of the reflecting line varies with length in accordance with the desired pulse shape. A high voltage input pulse is transmitted to the reflecting line. A reflected pulse is produced having the desired shape and is transmitted by pulse removal means to a load. Light activated photoconductive switches made of silicon can be utilized. The pulse shaper can be used to drive a Pockels cell to produce shaped optical pulses.

16 Claims, 7 Drawing Figures

PULSE SHAPING WITH TRANSMISSION LINES

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

The invention relates generally to transmission lines and more particularly to high voltage pulse shaping.

The Nova Laser at LLNL is a high power laser having multiple amplifier chains. A master oscillator provides optical pulses with selectable duration for input to the amplifier chains. To generate these optical pulses light from a long pulse oscillator is passed through a Pockels cell gate driven by a shaped high voltage pulse. To create a properly shaped optical pulse a properly shaped high voltage pulse is required. Ideally, the pulse from the laser amplifier should be uniform, i.e., squarewave. However, gain saturation in the amplifier changes the pulse shape so that a squarewave input pulse will not produce a squarewave output pulse. Gain saturation causes reduction in gain over the duration of the pulse and thus temporal distortion. Therefore, the input pulse must be shaped to compensate for the distortion produced in the amplifier so that the output pulse has the desired shape. Conventional electronic circuits do not provide the required pulse shaping capability.

Accordingly, it is an object of the invention to provide method and apparatus for forming high voltage pulses.

It is another object of the invention to produce high voltage pulses of a selected shape.

It is a further object of the invention to provide method and apparatus by which the pulse shape may be easily changed.

It is also an object of the invention to produce shaped high voltage pulses to drive a Pockels cell gate to generate optical pulses for a laser amplifier system.

SUMMARY OF THE INVENTION

The invention is method and apparatus for producing and shaping a pulse using passive reflection from a transmission line with nonuniform impedance. A square pulse produced by an initial pulse generator is reflected at a reflecting transmission line having an impedance which varies with distance according to the desired pulse shape. The reflected pulse is removed through pulse removal means, e.g., by passing back through the initial pulse generator, or alternatively by a different path, to a load. In one preferred embodiment a charged transmission line between a pair of light activated silicon switches is utilized; one switch becomes conductive to discharge the line and produce the initial squarewave pulse. This switch remains open for the reflected shaped pulse to pass back and through the other switch which is now also conductive to the load. In alternate embodiments other switches including spark gaps and field effect transistors are used. Microwave directional couplers may also be utilized in an embodiment in which the reflected pulse does not pass back through the initial pulse generator.

DETAILED DESCRIPTION OF THE PREFERRED EMBODIMENT

Figure 1:
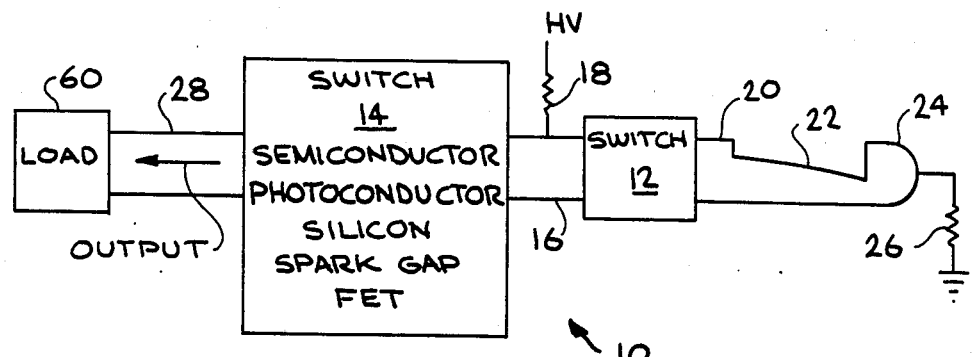
FIG. 1 is a schematic diagram of a transmission line high voltage pulse shaper using semiconductor switches.

A transmission line high voltage pulse shaper 10 is shown schematically in FIG. 1. Light activated silicon switches 12 and 14 are initially in a high resistance (nonconducting) state. Transmission line 16 is charged to a high voltage through resistor 18; transmission line 16 is connected between switches 12 and 14. Transmission line 16 is connected through switch 12 to transmission line 20 which is connected to reflector transmission line 22 which ends in terminator 24 which is grounded through resistor 26. Transmission line 16 is also connected through switch 14 to output transmission line 28. Reflector transmission line 22 is a section whose impedance varies with distance according to the desired pulse shape.

In operation, after line 16 is charged, switch 12 is illuminated, becomes conducting and discharges line 16 into line 20 creating a square pulse. The pulse travels down line 20 to line 22. When the leading edge of the pulse encounters line 22 a reflection will be created which travels back along line 20 towards switch 12 which remains conducting. Switch 14 is now also illuminated and conducting so the reflected pulse passes back through switch 12 and through switch 14 to line 28. The reflected pulse travels back unimpeded through switches 12 and 14 since these switches turn off very slowly, although they turn on very quickly. In this configuration, the reflected shaped pulse passes back through the initial pulse generator.

A variety of switches can be utilized, including any high voltage switch with a short risetime. In a preferred embodiment of the invention photoconductive switches (Auston switches) are used which are formed of a slab of near-intrinsic semiconductor material, such as silicon, with two spaced ohmic contacts. Carriers freed by photoelectric conversion of light are available to conduct current across a gap between the two contacts. When the silicon switch is illuminated by a light pulse the illuminated region becomes conductive forming a conductive path between the two contacts so that a voltage on one contact is switched to the other. The risetime of the switch is extremely short, i.e., subnanosecond, but the switch remains in the conductive state for a much longer time, i.e., hundreds of nanoseconds. The important characteristics of the silicon switches are that the switches have a high voltage hold off capability and switch on very rapidly. U.S. Pat. No. 3,917,913 to Auston discloses a silicon photoconductive switch or Auston switch; U.S. Pat. No. 4,218,681 to Mourou also discloses a laser activated semiconductor switch. This type of switch can be utilized in particular embodiments of the invention and these patents are hereby incorporated by reference. Alternatively, other types of switches, including spark gaps and field effect transistors, can be used.

Figure 2:
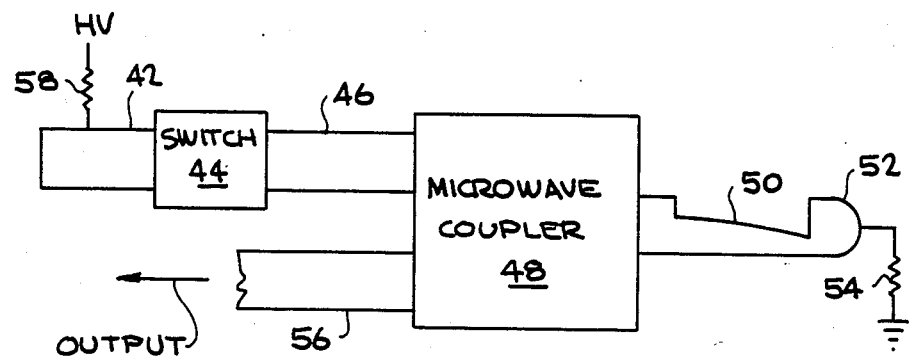
FIG. 2 is a schematic diagram of a transmission line high voltage pulse shaper using a directional coupler.

The principles of the invention can also be embodied in a configuration using a microwave directional coupler as illustrated in FIG. 2. Transmission line 42 is connected through high voltage switch 44 to transmission line 46 which is connected to directional coupler 48 which is connected to reflector transmission line 50 which ends in terminator 52 which is grounded through resistor 54. The directional coupler is also connected to output transmission line 56. Transmission line 42 is charged by applying a high voltage through resistor 58. Switch 44 is any high voltage switch with a short rise time. When switch 44 becomes conducting a pulse travels through line 46 to reflecting transmission line 50 which has an impedance which varies with length in a predetermined manner to produce a reflected pulse of a desired shape. An output pulse is produced from the reflected pulse by directional coupler 48. In this configuration, the reflected shaped pulse does not pass back through the initial pulse generator (line 42 and switch 44) but by a separate path, line 56.

Figure 3A:
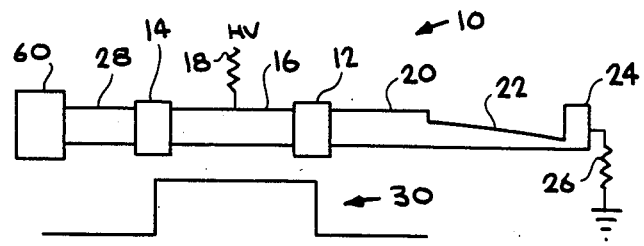
FIGS. 3A to 3D illustrate the formation of a shaped pulse by the pulse shaper of FIG. 1.
Figure 3B:
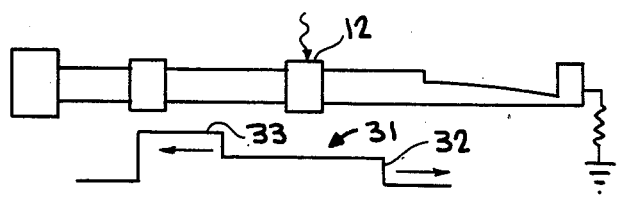
Figure 3C:
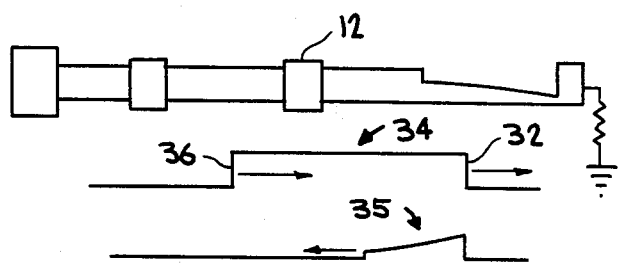
Figure 3D:
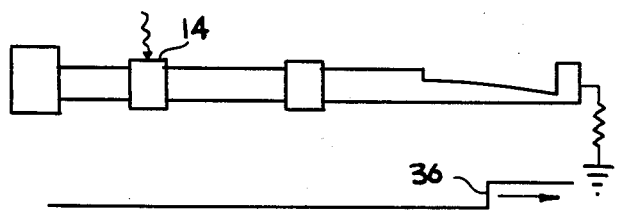
Figure 3D:
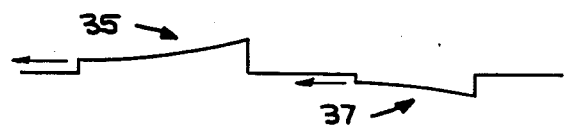

The principles of pulse formation, according to the invention, are further illustrated with reference to FIGS. 3A, B, C, D which shows a pulse shaper 10 as in FIG. 1, connected to a load 60. In FIG. 3A switches 12, 14 are nonconducting and line 16 is charged to a high voltage, as represented by voltage waveform 30. In FIG. 3B, switch 12 is illuminated and discharges voltage waveform 30 into line 20, producing voltage waveform 31 which has a leading edge 32 which propagates toward reflector line 22; a pulse 33 is also produced which moves toward the nonconducting switch 14. As the leading edge 32 of input pulse 34 propagates along reflector line 22, as shown in FIG. 3C, a reflected pulse 35 is produced which propagates back along line 20 toward conducting switch 12; pulse 33 is reflected from nonconducting switch 14 and forms trailing edge 36 of input pulse 34 which also travels toward reflector line 22. The impedance of line 22 varies along its length so that as leading edge 32 of input pulse 34 propagates along line 22 toward terminator 24 to ground, reflected pulse 35 is produced with the desired shape. The reflected pulse 35 propagates back through conducting switch 12 as shown in FIG. 3D; switch 14 is also illuminated at this time so that reflected pulse 35 passes to load 60. As trailing edge 36 of input pulse 34 propagates along line 22, an additional pulse 37 is also formed which propagates back through pulse shaper 10.

The invention operates by generating a reflection which is a varying function of time when the rising edge of an input pulse encounters a section of transmission line along which the impedance is a varying function of length. Thus, control of the temporal shape of the voltage pulse is achieved by controlling the impedance along the length of the reflective transmission line. In one embodiment a microstrip of varying width is utilized. In a preferred embodiment, a transmission line with an impedance which is adjustable along its length is formed by mounting a flexible metal strip in a spaced relationship to a ground surface by means of position adjustment means which allow the distance between the metal strip and ground surface to be selectably varied. A plurality of micrometers are suitable for the position adjustment means. The transmission line impedance may be any function of length, e.g., increasing, decreasing, stepped, or any more complex function, to produce the desired shape in the reflected pulse.

The input pulse should have frequency components within the frequency range of reflection. This can be accomplished by either producing an input pulse of suitable frequency for a particular reflecting line or by choosing a reflecting line with suitable characteristics, e.g., length, for a particular input pulse. The general goal is to match the bandwidth of the input pulse, which is primarily a function of its risetime, with the bandwidth of reflectivity of the reflecting line, which is primarily determined by its length and the rate of change of impedance with length.

Figure 4:
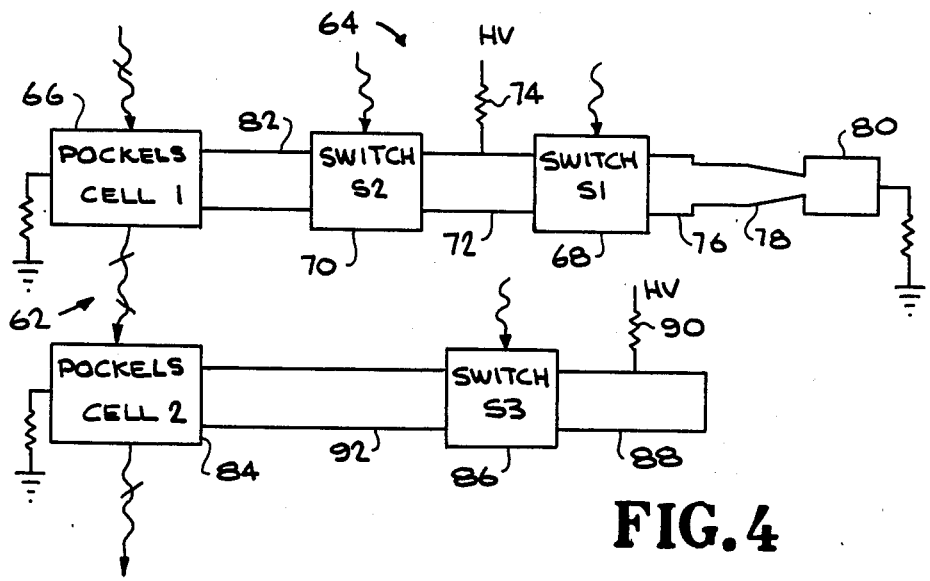
FIG. 4 is a schematic diagram of a system using a high voltage pulse shaper for modulation of optical pulses.

A system 62 for modulation of laser pulses is illustrated in FIG. 4. This system 62 includes a high voltage pulse shaper 64, as previously described, which drives Pockels cell 66. Switches 68 and 70 are initially in a high resistance or nonconducting state. Transmission line 72 is charged to a high voltage through resistor 74. Switch 68 is illuminated with a short pulse, typically 100 ps, which discharges line 72 into line 76. The input pulse travels along line 76 until the leading edge encounters the reflector line 78 which produces a reflection which travels back toward switch 68 which is still in a conducting state. Reflector line 78 ends in terminator 80. A short pulse is applied to switch 70, typically 100 ps, so that the reflected pulse passes through switch 70 and output line 82 to Pockels cell 66. Thus, the voltage signal driving Pockels cell 66 is the desired signal, the reflected pulse passed back through switches 68 and 70. Pockels cell 66 is a gate for a relatively long input laser pulse, typically about 300 ns.

However, the output signal from pulse shaper 64 also includes other signals including the reflection from the following edge of the input square pulse. To eliminate the light passing through Pockels cell 66 due to the spurious signals, Pockels cell 84 is placed in series with Pockels cell 66 so that the output light pulse from Pockels cell 66 will be gated by Pockels cell 84. Pockels cell 84 is driven by a square pulse precisely synchronized with the shaped pulse produced by pulser 64. A high voltage is applied to transmission line 88 through resistor 90. Semiconductor switch 86 is illuminated with a portion of the same optical pulse that illuminates switch 68. Line 88 is the same length as the reflector line 78 and is discharged into line 92 which is connected to Pockels cell 84.

Changes and modifications in the specifically described embodiments can be carried out without departing from the scope of the invention which is intended to be limited only by the scope of the appended claims.

I claim:

1. Apparatus for forming a voltage pulse of a desired shape, comprising:
   means for generating an input pulse;
   a reflecting transmission line connected to the means for generating an input pulse, the reflecting transmission line having an impedance which varies with length to produce a reflected pulse having a desired pulse shape;
   pulse removal means connected to the reflecting transmission line for transmitting a shaped reflected pulse to a load;
   the means for generating an input pulse and pulse removal means comprising:
   a first and second switch in a normally nonconducting state;
   a first transmission line connected between the first and second switches;

the first transmission line being connected to the reflecting transmission line through the first switch;

the first transmission line being connected to a load through the second switch.

2. The apparatus of claim 1 wherein the switches are semiconductor switches.

3. The apparatus of claim 2 wherein the switches are photoconductive switches.

4. The apparatus of claim 3 wherein the switches are silicon switches.

5. The apparatus of claim 1 wherein the switches are spark gap switches.

6. The apparatus of claim 1 wherein the switches are field effect transistors.

7. The apparatus of claim 1 further including high voltage means for charging the first line to a high voltage.

8. The apparatus of claim 7 further including switch activation means for causing the switches to become conductive.

9. The apparatus of claim 8 wherein the switch activation means first cause the first switch to become conductive to transmit an input pulse to the reflecting transmission line and to transmit a reflected pulse back from the reflecting transmission line, and then cause the second switch to become conductive to transmit the reflected pulse to a load.

10. The apparatus of claim 1 for producing a shaped optical pulse, further comprising a first Pockels cell connected to the pulse removal means.

11. The apparatus of claim 10 further comprising:

a second Pockels cell in optical alignment with the first cell so that a light beam transmitted through the first cell passes through the second cell;

means connected to the second cell for generating a gating signal that is synchronized with the shaped reflected pulse.

12. The apparatus of claim 11 wherein the means for generating an input pulse and means for generating a gating signal are synchronized.

13. The apparatus of claim 1 wherein the reflecting transmission line comprises a microstrip of varying width.

14. A method for generating a voltage pulse of a desired shape comprising:

producing an input pulse by transmitting a high voltage pulse through a first switch;

reflecting the input pulse from a reflecting transmission line with an impedance which varies with length to produce a pulse of a desired shape;

transmitting the reflected pulse to a load by transmitting the reflected pulse back through the first switch and through a second switch.

15. The method of claim 14 further comprising forming the first and second switches of photoconductive semiconductor switches, illuminating the first switch to produce the input pulse, and then illuminating the second switch to transmit the reflected pulse.

16. Apparatus for forming a voltage pulse of a desired shape, comprising:

means for generating an input pulse;

a reflecting transmission line connected to the means for generating an input pulse, the reflecting transmission line having an impedance which varies with length to produce a reflected pulse having a desired pulse shape;

pulse removal means connected to the reflecting transmission line for transmitting a shaped reflected pulse to a load;

the means for generating an input pulse and pulse removal means comprising:

a first switch in a normally nonconducting state;

a microwave directional coupler;

a first transmission line connected between the first switch and the microwave directional coupler;

the first transmission line being connected to the reflecting transmission line through the microwave directional coupler;

the reflecting transmission line being connected to a load through the microwave directional coupler.

* * * * *